United States Patent
Lee et al.

(10) Patent No.: US 10,237,988 B2
(45) Date of Patent: Mar. 19, 2019

(54) ELECTRONIC DEVICE

(71) Applicant: Samsung Electronics Co., Ltd., Suwon-si, Gyeonggi-do (KR)

(72) Inventors: Jun-Hui Lee, Hwaseong-si (KR); Jong-Hae Kim, Seoul (KR); Hee-Young Yun, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/054,933

(22) Filed: Feb. 26, 2016

(65) Prior Publication Data

US 2016/0255732 A1   Sep. 1, 2016

(30) Foreign Application Priority Data

Feb. 27, 2015 (KR) .................. 10-2015-0028657
Aug. 12, 2015 (KR) .................. 10-2015-0114036

(51) Int. Cl.
| | |
|---|---|
| H05K 5/02 | (2006.01) |
| H05K 5/00 | (2006.01) |
| H05K 13/00 | (2006.01) |
| G04B 21/00 | (2006.01) |
| G04B 21/08 | (2006.01) |
| G04B 39/02 | (2006.01) |
| G06F 3/041 | (2006.01) |

(52) U.S. Cl.
CPC .......... H05K 5/0017 (2013.01); G04B 21/00 (2013.01); G04B 21/08 (2013.01); G04B 39/02 (2013.01); G04B 39/025 (2013.01); G06F 3/0412 (2013.01); H05K 5/02 (2013.01); H05K 13/00 (2013.01)

(58) Field of Classification Search
CPC .... H05K 5/0017; H05K 5/02; H05K 13/0023; G06F 1/163; G06F 3/0412; G04B 39/025; G04B 21/00; G04B 21/08; G04B 39/02
See application file for complete search history.

(56) References Cited

U.S. PATENT DOCUMENTS

| | | | | |
|---|---|---|---|---|
| 4,558,955 | A | 12/1985 | Herchenbach | |
| 6,177,971 | B1 * | 1/2001 | Jung | G02F 1/133308 349/58 |
| 6,456,569 | B1 * | 9/2002 | Stauffer | G04B 19/06 368/236 |
| 2005/0111307 | A1 * | 5/2005 | Saaski | G04B 19/28 368/314 |
| 2011/0221688 | A1 * | 9/2011 | Byun | H04B 1/385 345/173 |

(Continued)

FOREIGN PATENT DOCUMENTS

| | | |
|---|---|---|
| EP | 1 128 239 A1 | 8/2001 |
| JP | 2007-285743 A | 11/2007 |
| KR | 10-0786309 B1 | 12/2007 |

*Primary Examiner* — Hoa C Nguyen
*Assistant Examiner* — Christopher L Augustin
(74) *Attorney, Agent, or Firm* — Jefferson IP Law, LLP

(57) ABSTRACT

An electronic device is provided. The electronic device includes a frame and a display member exposed through an opening of the frame. The display member includes a first glass exposed through the opening to an outside and a second glass disposed on a surface of the first glass. The second glass includes an area formed to project beyond an edge of the first glass such that the area is positioned inside the frame.

16 Claims, 11 Drawing Sheets

(56) References Cited

U.S. PATENT DOCUMENTS

| | | | |
|---|---|---|---|
| 2012/0098548 A1* | 4/2012 | Hayakawa | B60N 2/002 324/601 |
| 2012/0098755 A1* | 4/2012 | Lin | G06F 3/044 345/173 |
| 2014/0049506 A1 | 2/2014 | Lin | |
| 2014/0176853 A1 | 6/2014 | Wang et al. | |
| 2015/0311960 A1* | 10/2015 | Samardzija | G06F 1/163 455/90.3 |
| 2016/0035284 A1* | 2/2016 | Jung | G06F 1/163 345/206 |

* cited by examiner

ELECTRONIC DEVICE

CROSS-REFERENCE TO RELATED APPLICATION(S)

This application claims the benefit under 35 U.S.C. § 119(a) of a Korean patent application filed on Feb. 27, 2015, in the Korean Intellectual Property Office and assigned Serial number 10-2015-0028657, and a Korean patent application filed on Aug. 12, 2015, in the Korean Intellectual Property Office and assigned Serial number 10-2015-0114036, the entire disclosure of each of which is hereby incorporated by reference.

TECHNICAL FIELD

The present disclosure relates to electronic devices.

BACKGROUND

An electronic device means a device performing a particular function according to its equipped program, such as a home appliance, an electronic scheduler, a portable multimedia player, a mobile communication terminal, a tablet personal computer (PC), a video/sound device, a desktop PC or laptop computer, a navigation for automobile, etc. For example, electronic devices may output stored information as voices or images. As electronic devices are becoming highly integrated and equipped to operate at high-speeds, high-volume wireless communication are becoming commonplace and mobile communication terminals are therefore being equipped with various functions. For example, an electronic device comes with an integrated functionality, including an entertainment function, such as playing video games, a multimedia function, such as replaying music/videos, a communication and security function for mobile banking, and a scheduling or e-wallet function, etc.

Electronic devices to carry, such as electronic schedulers, portable multimedia players, mobile communication terminals, tablet PCs, etc., are generally equipped with a flat-type display device and a battery and have a bar, clamshell, or slidable shape. Recent developing electronic communication technologies have smaller-sized electronic devices, resulting in electronic devices which may be put on a user's wrist, head, or other body portion, so-called wearable electronic devices, coming to the market.

A wearable device, e.g., a watch-type wearable device worn on a user's wrist, may not only provide its own functions, as a wristwatch, but may also be connected with an external device to communicate data. Further, the wearable device may implement various functions including multimedia functions, such as capturing images, displaying videos, replaying music files, and detecting the wearer's bio signals.

Watch-type electronic devices need to be made to have a relatively small size an as to be worn on the user's body, but their display area or active area for displaying screen or implementing input and output need to be relatively large for user convenience.

Areas other than the display area, e.g., a bezel that surrounds an active area (i.e. display portion) and shields itself for signal lines and circuits, when increased in size, may lead the active area to be relatively small in size, thus causing user inconvenience when using the electronic device.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device.

In accordance with an aspect of the present disclosure, an electronic device is provided. The electronic device includes a frame having an opening and a display member having a glass part such that the glass part is provided inside the frame, exposed through the opening, and fixed and seated on the frame. An edge portion having a step configuration from a surface of the glass part is provided on an edge surface of the glass part. The glass part provided at an upper side of the edge portion is exposed through the opening, and the glass part provided at a lower side of the edge portion is fixed by the frame to fasten the glass part to the frame.

In accordance with another aspect of the present disclosure, an electronic device is provided. The electronic device includes a frame and a display member exposed through an opening of the frame. The display member includes a first glass exposed through the opening to an outside and a second glass disposed on a surface of the first glass. The second glass includes an area formed to project beyond an edge of the first glass such that the area is positioned inside the frame.

In accordance with another aspect of the present disclosure, a method of forming a body of an electronic device is provided. The method includes stacking a second glass on an upper surface of a display panel such that the second glass comprises a larger surface area than the display panel and an edge portion of the second glass extends over an edge portion of the display panel, and stacking a first glass on an upper surface of the second glass such that the first glass comprises a smaller surface area than both of the second glass and the display panel so as to be inserted through an opening of a frame of the body so that an upper surface of the first glass is exposed to an outside.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
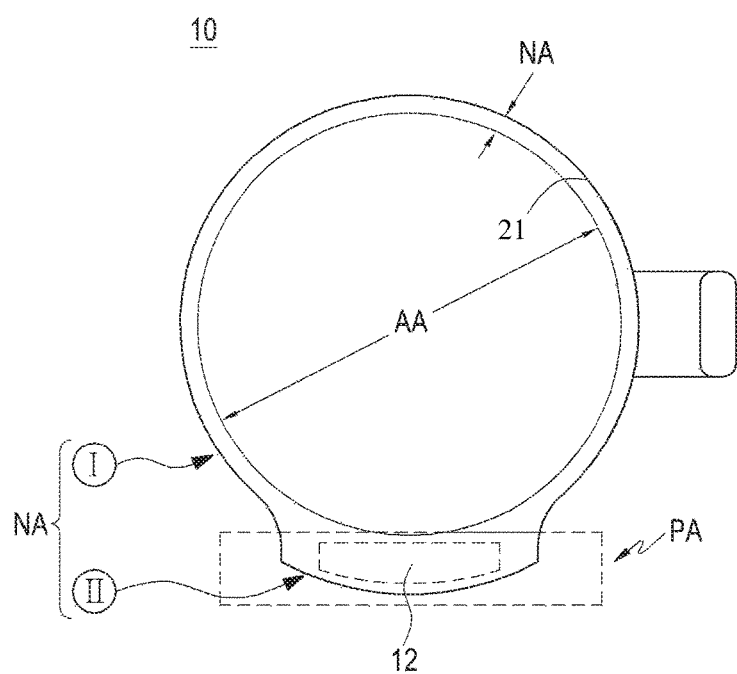
FIG. 1 is a view illustrating a display assembly of a general watch-type electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "comprise" and/or "comprising" as herein used specify the presence of disclosed functions, operations, or components, but do not preclude the presence or addition of one or more other functions, operations, or components. It will be further understood that the terms "comprise" and/or "have," when used in this specification, specify the presence of stated features, integers, operations, elements, and/or components, but do not preclude the presence or addition of one or more other features, integers, operations, elements, components, and/or groups thereof.

As used herein, the term "and/or" includes any and all combinations of one or more of the associated listed items. For examples, "A or B" may include A, or include B, or include both A and B.

Ordinal numbers as herein used, such as "first", "second", etc., may modify various components of various embodiments, but do not limit those components, For example, these terms do not limit the order and/or importance of the components. These terms are only used to distinguish one component from another. For example, a first user device and a second user device are different user devices from each other. For example, according to various embodiments of the present disclosure, a first component may be denoted a second component, and vice versa without departing from the scope of the present disclosure.

When a component is "connected to" or "coupled to" another component, the component may be directly connected or coupled to the other component, or other component(s) may intervene therebetween. In contrast, when a component is "directly connected to" or "directly coupled to" another component, no other intervening components may intervene therebetween.

Unless otherwise defined, all terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to an embodiment of the present disclosure, the electronic device may be the electronic device illustrated in FIGS. 3-10 or the electronic device illustrated in FIGS. 11-15 described below in connection with embodiments of the present disclosure.

For example, according to an embodiment of the present disclosure, examples of the electronic device may include, but is not limited to, a smartphone, a tablet personal computer (PC), a mobile phone, a video phone, an e-hook reader, a desktop PC, a laptop computer, a netbook computer, a personal digital assistant (PDA), a portable multimedia player (PMP), a Moving Picture Experts Group phase 1 (MPEG-1), a Moving Picture Experts Group phase 2 (MPEG-2), a Moving Picture Experts Group Audio Layer-III (MP3) player, a mobile medical device, a camera, and a wearable device (e.g., a head-mounted device (HMD), electronic clothes, an electronic bracelet, an electronic necklace, an electronic appcessory (the appcessory is a compound wording from "application"+"accessory", which refers to a device connected through an application and an electronic device such as a smart phone or tablet, or pc so as to perform various functions) an electronic tattoo, and a smart watch).

According to an embodiment of the present disclosure, the electronic device may be a smart home appliance. For example, examples of the smart home appliance may include, but is not limited to, a television, a digital versatile disc (DVD) player, an audio player, a refrigerator, an air conditioner, a vacuum cleaner, an oven, a microwave oven, a washer, a drier, an air cleaner, a set-top box, a television (TV) box (e.g., Samsung HomeSync™, Apple TV™, or GoogleTV™) a gaming console, an electronic dictionary, a camcorder, and an electronic picture frame.

According to an embodiment of the present disclosure, examples of the electronic device may include, but is not limited to, various medical devices (e.g., a magnetic resource angiography (MRA) device, a magnetic resource imaging (MRI) device, a computed tomography (CT) device, an imaging device, or an ultrasonic device), a navigation device, a global positioning system (GPS) receiver, an event data recorder (EDR), a flight data recorder (FDR), an automotive infotainment device, a sailing electronic device (e.g., a sailing navigation device, a gyroscope, and a compass), avionics, security devices, vehicular head units, industrial or home robots, automatic teller machines (ATMs), or point of sales (POS) devices.

According to various embodiments of the disclosure, examples of the electronic device may include, but is not limited to, a piece of furniture with a communication function, part of a building/structure, an electronic board, an electronic signature receiving device, a projector, or various measurement devices (e.g., devices for measuring water, electricity, gas, or electromagnetic waves).

According to an embodiment of the present disclosure, the electronic device may be one or a combination of the above-listed devices or appliances. According to an embodiment of the present disclosure, the electronic device may be a flexible device. According to an embodiment of the present disclosure, the electronic device is not limited to the above-listed devices or appliances.

As used herein, the term "user" may denote a human or another device (e.g., an artificial intelligent electronic device) using the electronic device. As used herein, the term "wearer" may denote a person that wears a head mounted device on his head to use contents provided from the head mounted device or an electronic device detachably mounted onto the head mounted device.

Figure 2A:
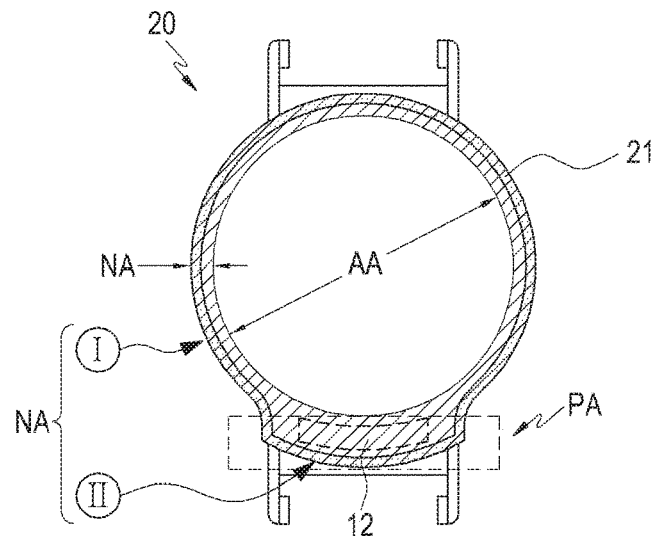
FIGS. 2A-2C are views respectively illustrating different shapes of frames having display members in watch-type electronic devices according to various embodiments of the present disclosure.
Figure 2B:
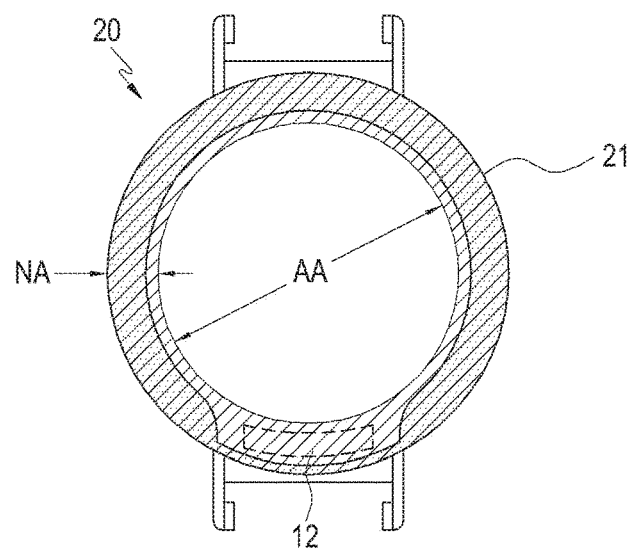
Figure 2C:
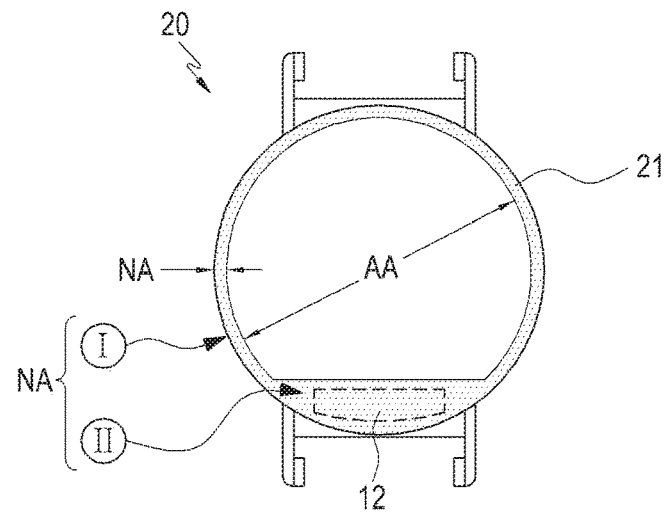

FIG. 1 is a view illustrating a display assembly of a general watch-type electronic device 20 according to an embodiment of the present disclosure. FIGS. 2A-2C are views respectively illustrating different shapes of frames 21 having display members 10 in watch-type electronic devices 20 according to various embodiments of the present disclosure.

Referring to FIGS. 1-2C, the watch-type wearable electronic device 20 may include a frame 21 with a display member 10 and a wearing portion (not shown), e.g., a band, to allow the frame 21 to be put on the user's body.

The display member 10 may be supported by the frame 21 and may be provided so that a plurality of panels, e.g., a display panel, such as a liquid crystal display (LCD), a touch panel, and a glass panel, may be stacked. The display member 10 may be provided to display a screen and implement inputs and outputs through a surface thereof. The display member 10 where the panels are stacked may be partitioned to an active area AA and a non-active area NA. The active area AA corresponds to an area that may display a screen and implement inputs and outputs. The non-active area NA corresponds to an area that surrounds the active area AA and has electronic signal lines of e.g., the touch panel or display panel. Electronic signal lines of, e.g., the touch panel or display panel or a circuit portion 12 for integrating and connecting such signal lines to a circuit board embedded in the frame 21, may be arranged in the non-active area NA.

The non-active area NA has different sizes for an area I where the signal lines are positioned and an area II where the circuit portion 12 is provided. In other words, the area I, where the signal lines of the non-active area NA are positioned, may be formed with a constant thickness from an edge of the active area AA, and the non-active area NA where the circuit portion 12 is positioned, i.e., area II, is provided to project beyond the area. Accordingly, a portion of a shielding portion (illustrated in FIGS. 5 and 6) mounted to shield the area I of the non-active area NA may be provided to have a circular band shape. The remainder of the shielding portion mounted to shield the area II of the non-active area NA may be thicker than the portion mounted to shield area I and is mounted to shield up to a protrusion of the display member 10.

However, as at least a portion of the display member 10 is provided to project to shield the circuit portion 12, the display member 10 may have a portion of a circular shape and the remainder of a shape projecting from the edge of the circular shape. In other words, referring to FIG. 1, although the area I of the display member 10 has a circular shape of an edge, the area II of the display member 10 may project outwards like, e.g., a hot air balloon.

The hot air balloon-shaped display member 10 has a structure that is attached in a top-down manner downwards from over top of the frame 21.

When the frame 21 is coupled with the display member 10 in the top-down manner, the display member 10 having the hot air balloon shape as shown in FIGS. 2A-2C may be exposed to the outside of the frame 21, while maintaining its shape.

Referring to FIG. 2A, as the frame 21 has the same shape, e.g., a hot air balloon shape, as the display member 10 along the edge of the display member 10, the overall size of the electronic device may be reduced.

Alternatively, referring to FIG. 2B, the display member 10 may be seated on the circular-shaped frame 21 to allow the electronic device to have a circular shape. In other words, the frame 21 of the electronic device and the size of the shielding portion may be formed in a circular shape, fitting the broadest size of the shielding portion. For example, the frame 21 may be formed to have a size in which a projecting area (PA) of the display member 10 may be covered, and the shielding portion may be mounted to shield the area surrounding the active area AA. Accordingly, the frame 21 may be provided in a circular shape, and the size of the shielding portion may be provided to be on the edge of the active area AA.

Further, referring to FIG. 2C, the shielding portion m y be formed so that the frame 21 has a circular shape and is implemented as being slim. For example, the non-active area NA may be provided so that the frame 21 has a circular shape and the circuit portion 12 does not project from at least a portion of the edge of the circular-shaped active area AA and is positioned in the area II of the circular shape as shown in FIG. 2A.

Figure 3:
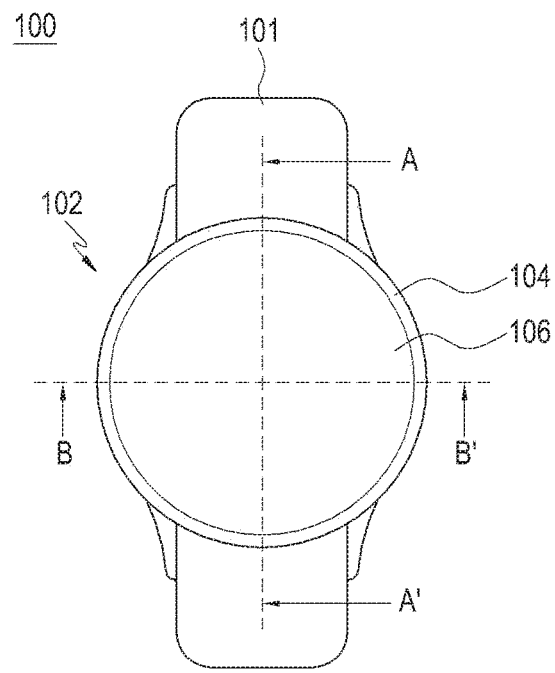
FIG. 3 is a view schematically illustrating an electronic device according to an embodiment of the present disclosure.

FIG. 3 is a view schematically illustrating an electronic device 100 according to an embodiment of the present disclosure.

Referring to FIG. 3, the electronic device 100 according to the present disclosure may be a watch-type wearable device 100. According to the present disclosure, the electronic device 100 may include a frame 104, a body 102 including a display member 106, and a wearing portion 101 allowing the body 102 to be worn by a user.

The body 102 may be an element that may display a screen and implement various functions.

The wearing portion 101 may be an instrument by which the user may use to put the body 102 on his/her body, e.g., a wrist. According to the present disclosure, the wearing portion 101 may include a band or strap formed of a material, e.g., a metallic material, fabric material, mineral material, or a combination thereof. The wearing portion 101 may include a device (not shown) that allows the body 102 to remain tightly fastened to a part of the user's body, e.g., the wrist.

Figure 4A:
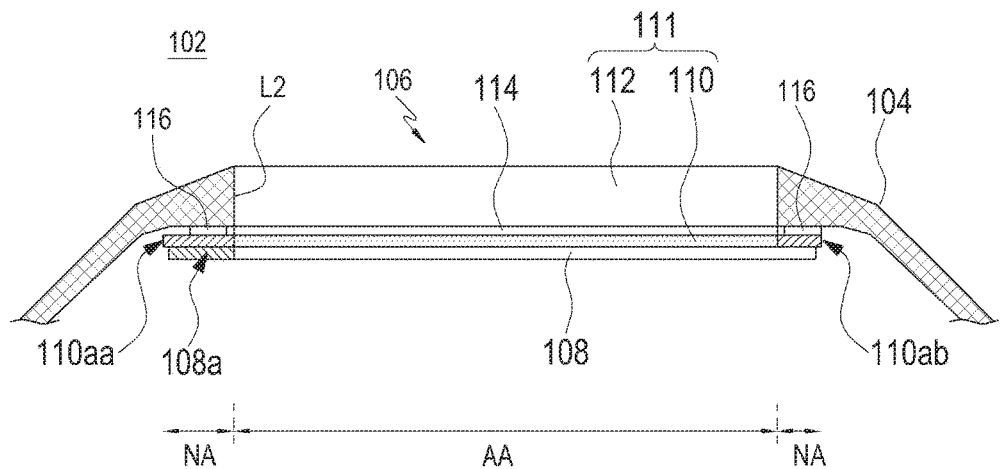
FIG. 4A is a schematic cross-sectional view taken along line A-A' of FIG. 3 according to an embodiment of the present disclosure.
Figure 4B:
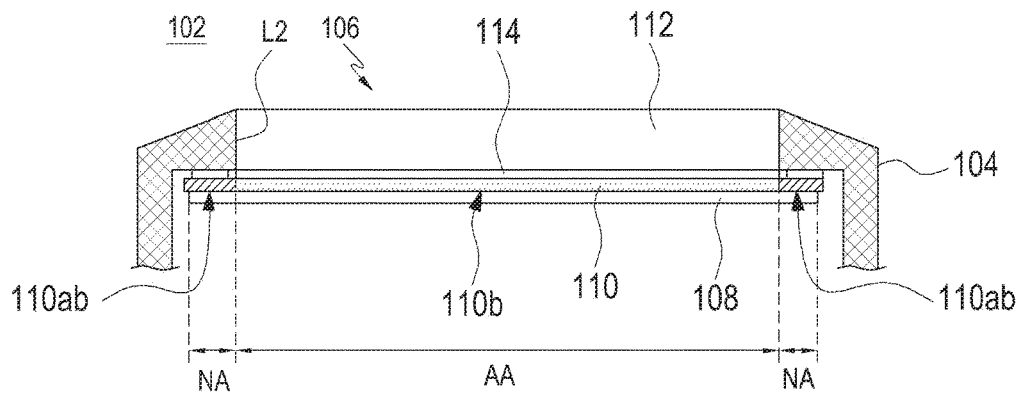
FIG. 4B is a schematic cross-sectional view taken along line B-B' of FIG: 3 according to an embodiment of the present disclosure.

FIG. 4A is a schematic cross-sectional view taken along line A-A' of FIG. 3 according to an embodiment of the present disclosure. FIG. 4B is a schematic cross-sectional view taken along line B-B' of FIG. 3 according to an embodiment of the present disclosure.

Referring to FIGS. 4A and 4B, according to an embodiment of the present disclosure, the body 102 may include the frame 104 and a display member 106.

The frame 104 may be mounted along the edge of the display member 106, to support and fasten the display member 106, and may have embed therein various modules, e.g., a printed circuit board (PCB) (not shown), a bracket (not shown), and a battery (not shown). An opening 104a (refer to FIG. 10) may be funned in a surface of the frame 104 to expose the screen of the display member 106.

The display member 106 may be exposed to a front surface of the body 102 to implement input and output according to a contact or approach of an object and may display an output according to a contact or approach of an object. The display member 106 may be provided so that a plurality of pane(s, e.g., a touch panel 108, a polarization panel (not shown), a display panel, and a glass panel 111, may be stacked. The display member 106 may be provided to output a screen or implement an input and/or output according to a contact.

Figure 10:
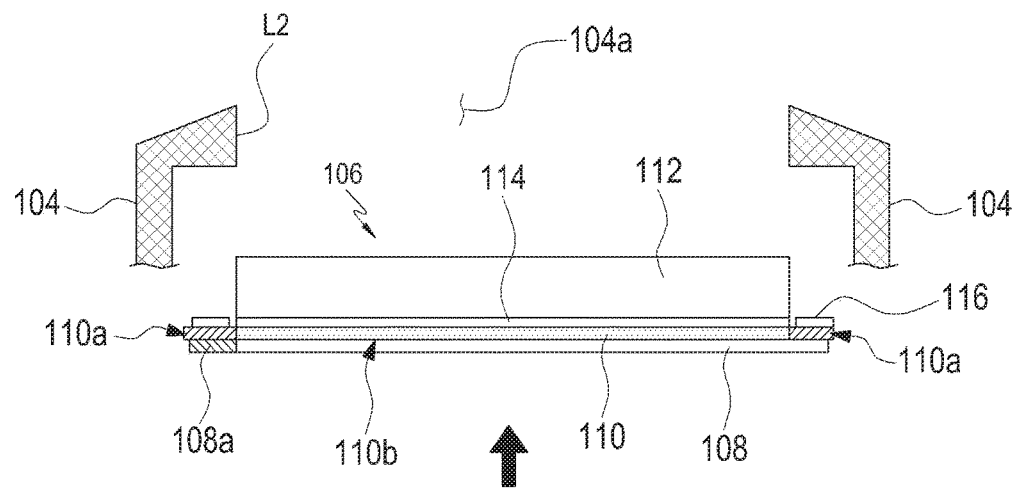
FIG. 10 is a view illustrating an example where a display member is assembled with a frame according to an embodiment of the present disclosure.

According to the present disclosure, the display member 106 may be provided to be assembled in a down-up manner from a lower portion of the frame 104 and upwards therefrom (refer to FIG. 10). As the display member 106 may be assembled in a down-up manner from the lower portion of the frame 104 and upwards therefrom, the whole or part of an area of the display member 106 where a shielding portion 113 is provided may be seated and shielded on the inside of the frame 104 as described below. Accordingly, the body 102 or the active area AA may be implemented in a circular shape while the size of the body 102 does not increase as compared with the related art.

The display panel may be a panel, such as an LCD or an active matrix organic light emitting diode (AMOLED), and may be an element that displays various images according to diverse operation states and an execution of applications and services implemented on the electronic device 100.

The touch panel 108 may be an element that senses a contact or an approach of an object to implement inputs and outputs and may be implemented in various manners, such as in a capacitive, resistive, or ultrasonic wave type.

The display member 106 may be partitioned into an active area AA and a non-active area NA depending on the structure of the touch panel 108 and display panel. For example, the active area AA corresponds to a portion in the display member 106, which displays a screen and senses a contact or approach of an object, and the non-active area NA corresponds to a portion positioned on the edge of the active area AA and where a circuit portion 108a and signal lines provided in the touch panel 108 and display panel may be arranged. The active area AA may be transparently formed so that a screen from the display panel may be projected therethrough, and the non-active area NA may be shielded by the shielding portion 113 described below so that the signal lines or circuit portion 108a may be shielded and not exposed to an outside of the electronic device 100.

Figure 5:
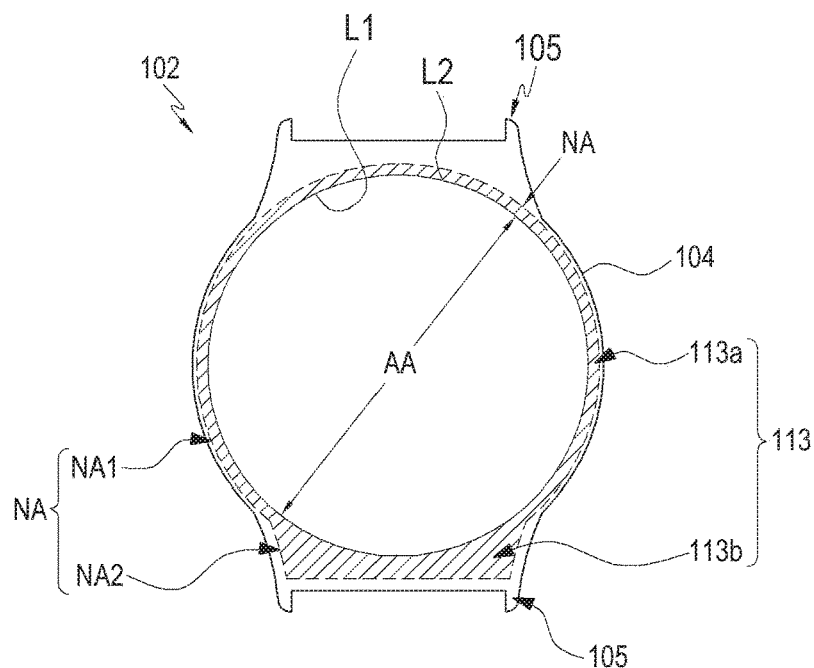
FIG. 5 is a view illustrating a non-active area disposed in a body of an electronic device and a shielding portion shielding the non-active area according to an embodiment of the present disclosure.
Figure 6:
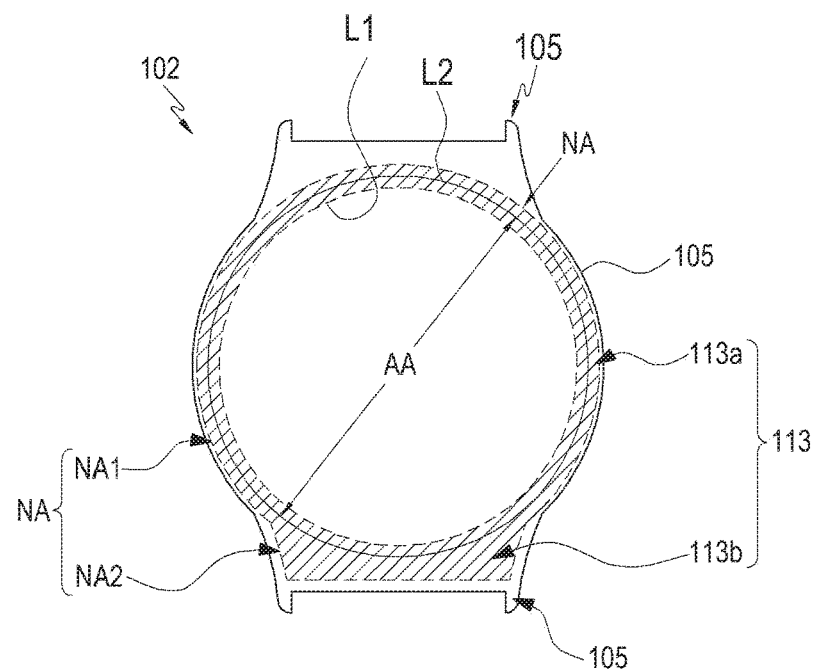
FIG. 6 is a view illustrating a non-active area disposed in a body of an electronic device and a shielding portion shielding the non-active area according to an embodiment of the present disclosure.

FIG. 5 is a view illustrating the non-active area NA disposed in the body 102 of the electronic device 100 and the shielding portion 113 shielding the non-active area NA according to an embodiment of the present disclosure FIG. 6 is a view illustrating the non-active area NA disposed in the body 102 of the electronic device 100 and the shielding portion 113 shielding the non-active area NA according to an embodiment of the present disclosure.

Referring to FIGS. 5 and 6, the non-active area NA may include a first non-active area NA1 and a second non-active area NA2.

The first non-active area NA1 may have signal lines arranged thereon and may be disposed with a constant thickness.

The second non-active area NA2 may be disposed in at least a portion of the first non-active area NA1 and may be provided to project outward relative to the first non-active area NA1. According to the present disclosure, the second non-active area NA2 may be positioned at a coupling portion 105 provided so that the wearing portion 101 may be coupled to the body 102.

The non-active area NA may be provided in an edge portion 110a (refer to FIG. 7) of a second glass 110 (refer to FIG. 9) described below or provided in the edge portion 110a and extending further inward from the edge portion 110a. Specifically, when the non-active area NA is formed in the edge portion 110a of the second glass 110, a boundary line L1 between the non-active area NA and the active area AA is positioned in an opened surface 12 of the frame 104 so that both may be shielded by the frame 104 (refer to FIG. 5), and when the non-active area NA is provided in the edge portion 110a and extending further inward from the edge portion 110a, the boundary line L1 between the non-active area NA and the active area AA may be placed at a position of the opening 104a (refer to FIG. 10) of the frame 104, so that the non-active area NA may be partially exposed to the outside (refer to FIG. 6).

As described above, the shielding portion 113 may be provided to shield the non-active area NA. The shielding portion 113 may be formed to have various color layers, such as black, white, and gold and may be provided in the glass panel 111 by printing or coating.

The area shielded by the shielding portion 113 may be substantially the same as the non-active area NA. Accordingly, the shielding portion 113 may include a first shielding portion 113a shielding the first non-active area NA1 and a second shielding portion 113b shielding the second non-active area NA2. The shielding portion 113 may be seated so that the display member 106 is fitted in a down-up manner upwards from a lower portion of the frame 104 to be covered by an inner circumferential surface of the frame 104. As such, as the shielding portion 113 is positioned on the inside of the frame 104, it may be prevented from being exposed to the outside (refer to FIG. 5). In such a case, a first glass 112 may be substantially the same in size as the active area AA. Alternatively, a portion of the shielding portion 113 may be exposed to the outside, and the remainder of the shielding portion 113 is positioned on the inside of the frame 104 to be prevented from exposure (refer to FIG. 6).

Figure 7:
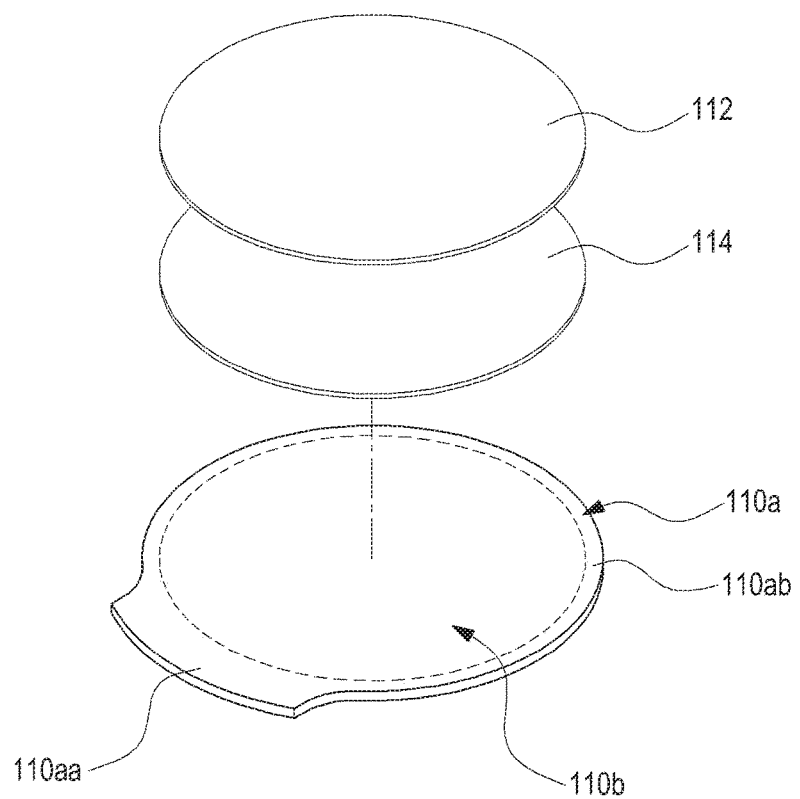
FIG. 7 is a perspective view illustrating an example where a glass panel is separated according to an embodiment of the present disclosure.
Figure 8:
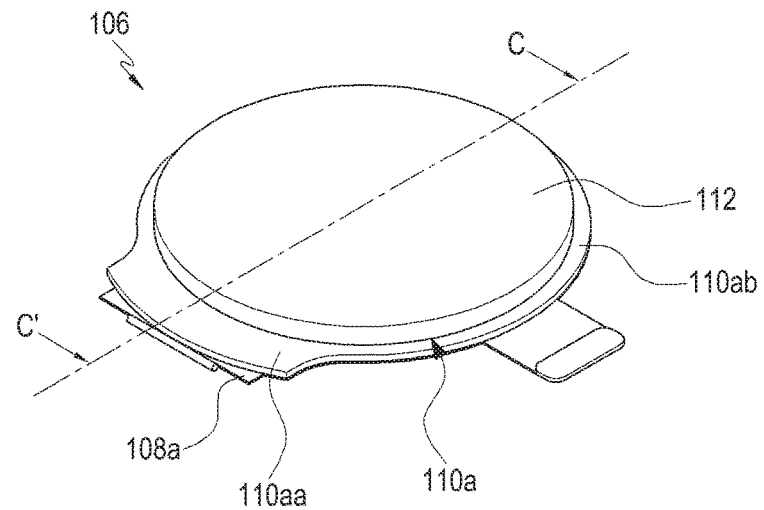
FIG. 8 is a perspective view illustrating an example where a display member is stacked and coupled according to an embodiment of the present disclosure.

FIG. 7 is a perspective view illustrating an example where the glass panel 111 is separated according to an embodiment of the present disclosure. FIG. 8 is a perspective view illustrating an example where a display member 106 is stacked and coupled according to an embodiment of the present disclosure.

Referring to FIGS. 7 and 8, the glass panel 111 may be stacked on an upper side of the touch panel 108 and may include the first glass 112 and the second glass 110.

The first glass 112 may pass through the opening 104a (refer to FIG. 10) of the frame 104 and may be seated in the opening 104a (refer to FIG. 10). The first glass 112 may be configured so that its surface is exposed to the outside and may be referred to as an outer glass. The size of the first glass 112 may be formed to correspond to the size of the opening 104a (refer to FIG. 10) of the frame 104. The first glass 112 may be shaped as a circle, and as described above, when the boundary line L1 between the non-active area NA and the active area AA has the same size as the opened surface L2, the edge size of the first glass 112 may be provided to have substantially the same size as the active area AA. Further, when the boundary line L1 between the non-active area NA and the active area AA is positioned at a side of the opening 104a (refer to FIG. 10), the size of the first glass 112 may be provided to be larger than the size of the active area AA.

The second glass 110 may be provided as an inner glass that is stacked on a lower surface of the first glass 112 and may be disposed on the inside of the frame 104. The second glass 110 may be formed to be larger in size than the first glass 112, and at least a portion of the second glass 110 may be formed to comprise a projection corresponding to the above-described circuit portion 108a. According to the present disclosure, at least a portion of the second glass 110 may be positioned at the coupling portion 105 so that the wearing portion 101 may be coupled to the body 102.

The second glass 110 may be formed to be larger in size, i.e., have a larger surface area, than the first glass 112. As the second glass 110 is provided to be larger in size than the first glass 112, it may be partitioned into a center portion 110b and an edge portion 110a.

The center portion 110b may be an area that faces a surface of the first glass 112 when the second glass 110 is stacked on the lower surface of the first glass 112. That is, a lower surface of the first glass 112 is stacked on an upper surface of the second glass.

The edge portion 110a may extend and project from an edge of the center portion 110b and may project beyond the edge of the first glass 112 on the outer surface of the center portion 110b. A surface of the edge portion 110a may be formed to have a step from the edge of the first glass 112.

The edge portion 110a may include a first area 110aa and a second area 110ab.

The first area 110aa may be formed to project beyond the edge of the first glass 112 and may have a constant width along the outside of the center portion 110b. The second area 110ab may be positioned in at least a portion of the first area 110aa, have a larger width than the first area 110aa, and may be provided to project beyond the first area 110aa.

The first area 110aa may be positioned to overlap the above-described second non-active area NA2. For example, the first area 110aa may overlap the second non-active area NA2 substantially identically, and in such case, the first area 110aa may be provided to have the same shape as the second non-active area NA2 of FIG. 5. Alternatively, when a portion of the first area 110aa overlaps the second non-active area NA2, it may be provided to overlap the area from the opened surface L2 of FIG. 6 to the inside of the frame 104.

Further, the second area 110ab may be positioned to overlap the above-described first non-active area NA1. For example, the second area 110ab may overlap the first non-active area NA1 substantially identically, and in such case, the second area 110ab may be provided to have the same shape as the first non-active area NA1 of FIG. 5. Alternatively, when a portion of the second area 110ab overlaps the first non-active area NA1, it may be provided to overlap the area from the opened surface L2 of FIG. 6 to the inside of the frame 104.

Accordingly, the edge portion 110a of the second glass 110 may be provided to overlap the non-active area NA in the same shape as the non-active area NA or may partially overlap the non-active area NA in a shape from the opened surface L2 to an outside thereof.

An optical clear adhesive (OCA) 114 may be included between the first glass 112 and the second glass 110 to attach the first glass 112 with the second glass 110.

According to an embodiment of the present disclosure, the first glass 112 and the second glass 110 may be formed of the same or different materials.

For example, the first glass 112 and the second glass 110 may include different materials as the first glass 112 and the second glass 110 are mounted at different positions. For example, the first glass 112 may be formed of a rigid material that may be prevented from damage, e.g., scratches or cuts, which may occur as it is exposed to the outside under the environment where it is carried. For example, the first glass 112 may be formed of sapphire. In contrast, the second glass 110, which is disposed under the first glass 112 and mounted inside the frame 104 to be free from cuts or scratches unlike the first glass 112, may be formed of a mineral material. Further, the second glass 110 and the first glass 112 both may be formed of sapphire, or the first glass 112 and the second glass 110 may both be formed of a mineral material.

Figure 9:
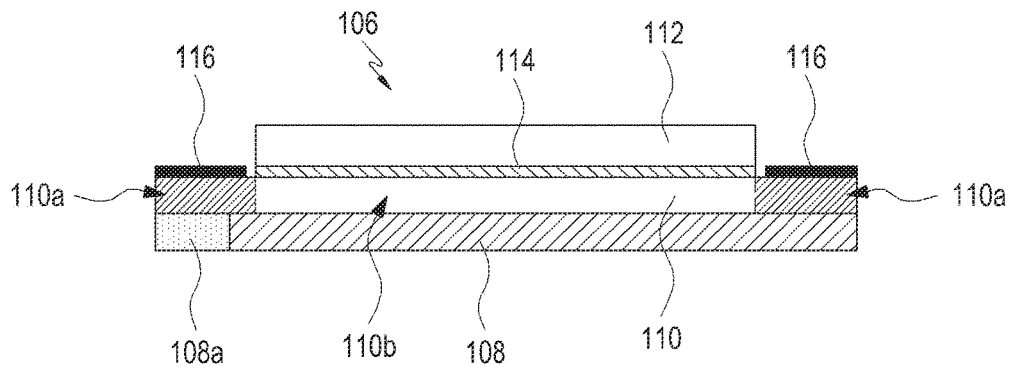
FIG. 9 is a schematic cross-sectional view taken along line C-C' of FIG. 8 according to an embodiment of the present disclosure.

FIG. 9 is a cross-sectional view taken along line C-C' of FIG. 8 according to an embodiment of the present disclosure. FIG. 10 is a view illustrating an example where a display member 106 is assembled with the frame 104 according to an embodiment of the present disclosure.

Referring to FIGS. 9 and 10, a sealing coupler 116 may be included on a surface of the edge portion 110a of the second glass 110 to allow the edge portion 110a to be tightly coupled to an inner surface of the frame 104. The sealing coupler 116 may be formed of a material, such as silicone or urethane.

In the display member 106 configured as described above, the first glass 112 may be positioned at the top, the second glass 110 may be disposed on a lower surface of the first glass 112 and attached to the first glass 112 through the OCA 114, and the touch panel 108, display panel (not shown), and polarization panel (not shown) may be disposed on a lower surface of the second glass 110.

The edge portion 110a of the second glass 110 may project beyond the edge of the first glass 112. In particular, the first area 110aa may be provided to project further than the second area 110ab. Thus, the first glass 112 may be formed to have a circular shape, and at least a portion of the edge of the second glass 110, at least partially, may be formed to have a circular shape while the remainder of the edge may project outwardly, so that the edge portion 110a of the second glass 110 is shaped like a hot air balloon.

Therefore, the overall shape of the glass panel 111 may correspond to that of a hot air balloon, but it is the circular-shaped first glass 112 that is exposed to the outside of the frame 104. Accordingly, the circular-shaped frame 104 and the circular-shaped second glass 110 are shown to the user. Further, although the non-active area NA is provided to have a hot air balloon shape, as the boundary line between the active area AA and the non-active area NA is positioned close to the circular-shaped opened surface L2 of the frame 104, the active area AA may have the size of the opening of the frame 104, and the size of the edge of the frame 104 may correspond to the size of the first area 110aa.

As such, according to the present disclosure, the display member 106 may be assembled upwards from under the frame 104, and double glass parts are stacked so that the glass panel 111 has a stepped edge. Accordingly, the edge of the glass panel 111 may be positioned inside the frame 104, allowing for the electronic device 100 with a minimized size frame 104 and shielding portion 113 exposed and a maximized size active area AA in which the body 102, shielding portion 113, and active area AA each have a circular shape regardless of the shape of the edge.

Hereinafter, an electronic device according to another embodiment of the present disclosure is described with reference to FIGS. 11 to 15. The same configuration, structure, and operation as the embodiment described above in connection with FIGS. 1 to 10 may apply to the electronic device according to the embodiment described below. Further, among FIGS. 1 to 10, FIGS. 3, 5, and 6 may also be applicable to the electronic device according to the embodiment described below, and these figures may be referenced in describing the same.

Figure 11:
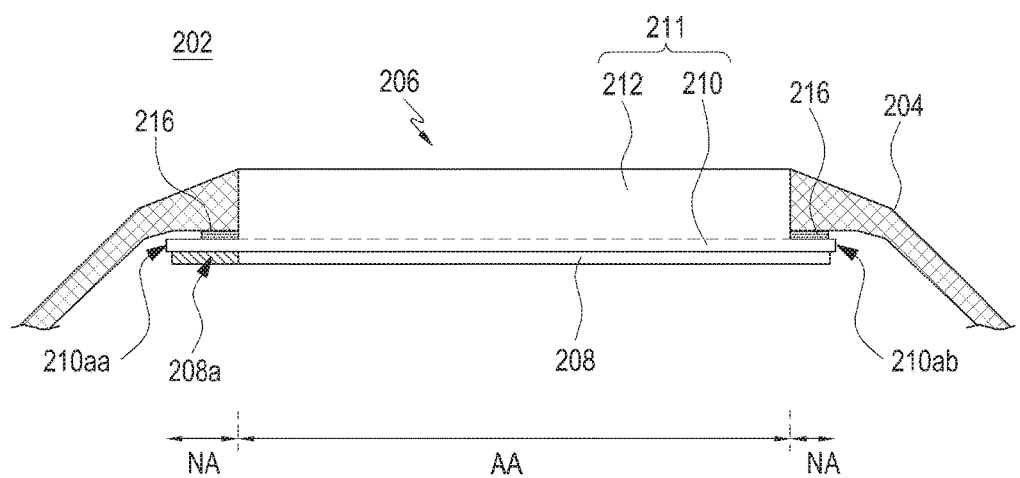
FIG. 11 is a schematic cross-sectional view of an electronic device viewed in a direction according to an embodiment of the present disclosure.
Figure 12:
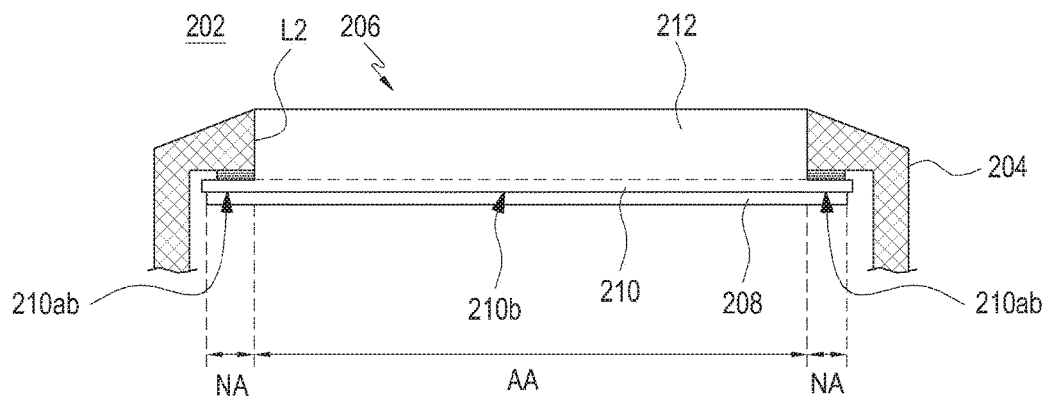
FIG. 12 is a schematic cross-sectional view of an electronic device viewed in a direction according to an embodiment of the present disclosure.

FIG. 11 is a schematic cross-sec tonal view of an electronic device viewed in a direction according to an embodiment of the present disclosure. FIG. 12 is a schematic cross-sectional view of an electronic device viewed in a direction according to an embodiment of the present disclosure.

Referring to FIGS. 11 and 12, the electronic device according to an embodiment of the present disclosure may be a watch-type wearable device. According to an embodiment of the present disclosure, the electronic device 100 (refer to FIG. 3) may include a frame 204, a body 202 including a display member 206, and the wearing portion 101 for allowing the body 202 to be worn by a user (refer to FIG. 3). The wearing portion 101 has the same configuration and structure as that described above, and thus, the same may apply.

According to an embodiment of the present disclosure, the body 202 may include the frame 204 and the display member 206.

The frame 204 may be mounted along the edge of the display member 206 to support and fasten the display member 206, and may embed therein various modules, e.g., a PCB (not shown), a bracket (not shown), and a battery (not shown). An opening 204a (refer to FIG. 15) may be formed on a surface of the frame 204 to expose a screen of the display member 206.

The display member 206 may be exposed to a front surface of the body 202 and may implement input and output according to a contact or approach of an object and may display an output according to a contact or approach of an object. The display member 206 may be provided so that a plurality of panels, e.g., a touch panel 208, a polarization panel (not shown), a display panel, and a glass portion 211 (hereinafter, "glass panel"), may be stacked. The display member 206 may be provided to output a screen or implement an input and/or output according to a contact.

Figure 15:
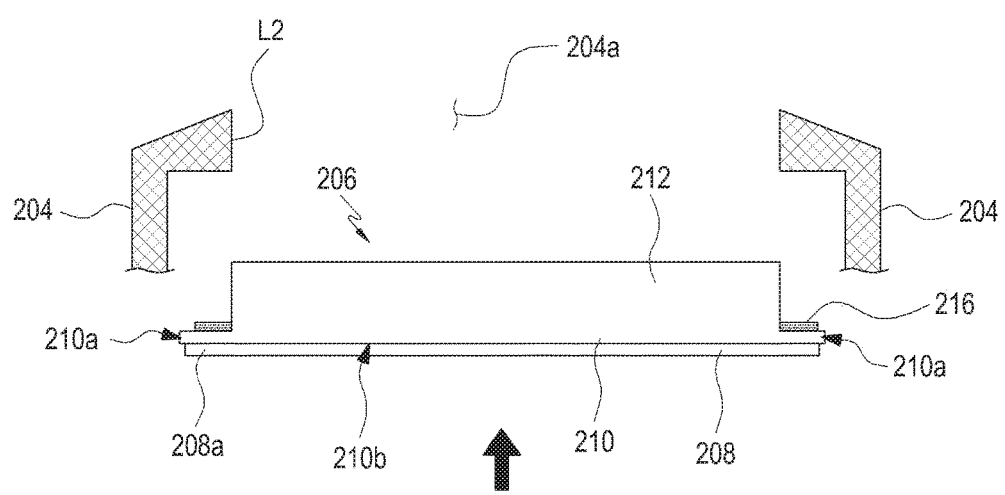
FIG. 15 is a view illustrating an example where a display member is assembled with a frame according to an embodiment of the present disclosure.

According to the present disclosure, the display member 206 may be provided to be assembled in a down-up manner from a lower portion of the frame 204 and upwards therefrom (refer to FIG. 15). As the display member 206 is assembled in a down-up manner from the lower portion of the frame 204 and upwards therefrom, the entire area or part of the area where the shielding portion 113 is provided may be seated and shielded on the inside of the frame 204 (refer to FIGS. 5 and 6). Accordingly, the body 202 or the active area AA may be implemented in a circular shape while the size of the body 202 does not increase as compared with the related art.

The display panel and the touch panel 208 have been described in connection with the above embodiment, and the same may apply.

According to an embodiment of the present disclosure, the display member 206 may be partitioned into an active area AA and anon-active area NA depending on the structure of the touch panel 208 and display panel (refer to FIGS. 5 and 6). As set forth above, the active area AA is a portion in the display member 206, which displays a screen and senses a contact or approach of an object, and the non-active area NA is a portion positioned on the edge of the active area AA where a circuit portion 208a and signal lines of the touch panel 208 and display panel may be arranged. The non-active area NA may be shielded by the shielding portion 113 described below to prevent the signal lines or circuit portion 208a from exposure.

The non-active area NA may include the first non-active area NA1 and the second non-active area NA2.

The first non-active area NA1 may have signal lines arranged and be disposed with a constant thickness.

The second non-active area NA2 may be disposed in at least a portion of the first non-active area NA1 and may be provided to project outward relative to the first non-active area NA1. According to the present disclosure, the second non-active area NA2 may be positioned at the coupling portion 105 so that the wearing portion 101 may be coupled to the body 202 (refer to FIGS. 3, 5, and 6).

The non-active area NA may be positioned to correspond to an edge portion 210a of the glass panel 211 as described below or provided in the edge portion 210a and extending further inward from the edge portion 210a. Specifically, when the non-active area NA is formed in the edge portion 210a, the boundary line L1 between the non-active area NA and the active area AA may be positioned in the opened surface L2 of the frame 204 so that both may be shielded by the frame 204 (refer to FIG. 5), and when the non-active area NA is provided in the edge portion 210a and extending further inward from the edge portion 210a, the boundary line L1 between the non-active area NA and the active area AA may be placed at the position of the opening 204a (refer to FIG. 15) of the frame 204, so that the non-active area NA may be partially exposed to the outside (refer to FIG. 6).

As described above, the shielding portion 113 according to an embodiment of the present disclosure may be provided to shield the non-active area NA. The shielding portion 113 may be formed to have various color layers, such as black, white, and gold and may be provided in the glass panel 211 or in a separate panel by printing or coating.

The area formed by the shielding portion 113 may be substantially the same as the non-active area NA. For example, the shielding portion 113 may include a first shielding portion 113a shielding the first non-active area NA1 and a second shielding portion 113b shielding the second non-active area NA2. According to an embodiment of the present disclosure, the display member 206 may be fitted in a down-up manner upwards from under the frame 204 to be seated and covered by an inner circumferential surface of the frame 204. The overall shielding portion 113 may be positioned to correspond to the position of the inside of the frame 204 to be prevented from being exposed to the outside (refer to FIG. 5). In such case, a first glass 212 projecting upwards of the glass panel may be formed to be substantially the same in size as the active area AA (refer to FIG. 5). Alternatively, a portion of the shielding portion 113, e.g., the inner circumferential surface of the shielding portion, may be exposed to the outside through the opening 204a, and the remainder of the shielding portion 113 may be positioned to correspond to the position of the inside of the frame 204 to be prevented from exposure (refer to FIG. 6).

Figure 13:
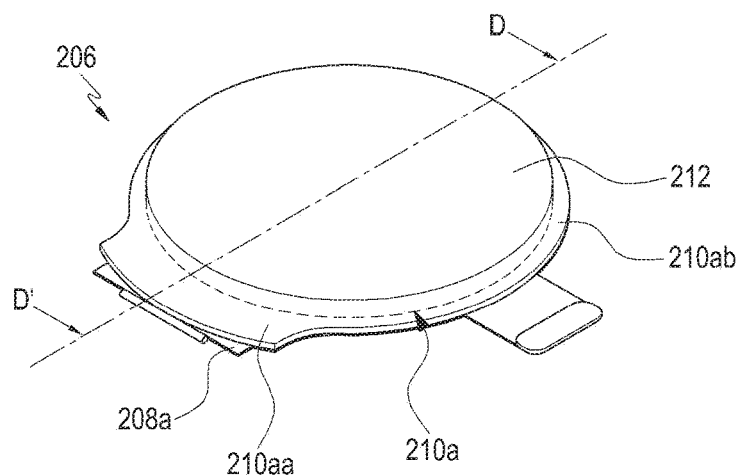
FIG. 13 is a perspective view illustrating a display member in an electronic device according to an embodiment of the present disclosure.

FIG. 13 is a perspective view illustrating a display member in an electronic device according to an embodiment of the present disclosure.

Referring to FIG. 13, according to an embodiment of the present disclosure, the glass panel 211 may be implemented as a single body. In other words, a difference between the electronic device described in connection with the above embodiment and the electronic device according to the below embodiment lies in the glass panel.

For example, the glass panel 111 described in connection with the above embodiment has a structure in which two members, i.e., the first glass 112 and the second glass 110 are stacked on each other. In contrast, the glass panel 211 according to the below embodiment of the present disclosure may be similar in shape to the glass panel 111 described in connection with the above embodiment. In other words, according to the above embodiment, when the first glass 112 and the second glass 110 are stacked and coupled with each other, an edge of the second glass 110 projects beyond an edge of the first glass 112 to have a step, whereas in the below described embodiment, the glass panel 211, although shown to be like the first glass 112 and the second glass 110 of the above embodiment, in which the first glass 112 and the second glass 110 are stacked and coupled, the glass panel 211 of the below embodiment may be formed as a single body.

Specifically, according to an embodiment of the present disclosure, the glass panel 211 may be disposed on an upper side of the touch panel 208, include the first glass 212 passing through the opening 204a to be seated to fit in the opening 204a and a second glass 210 integrally formed with the first glass 212 as a single body and seated to be stuck within the frame 204. Here, the term "single body" may denote one member rendered to have a shape by molding or processing, but not a combination of different members, and according to the present disclosure, the glass panel 211 may be partitioned into the first glass 212 and the second glass 210 depending on its shape for the purpose of description.

The first glass 212 may be formed to comprise a smaller outer diameter than the second glass 210 and project upward from the second glass 210. The first glass 212 may pass through the opening 204a (refer to FIG. 15) of the frame 204 and may be seated to fit in the opening 204a (refer to FIG. 15). The first glass 212 may be configured so that its surface is exposed to the outside, and as described in connection with the above embodiment, the first glass 212 may be implemented to function as an outer glass. The size of the first glass 212 may be formed to correspond to the size of the opening 204a (refer to FIG. 15) of the frame 204. The first glass 212 may have the same shape as the opening, e.g., a circle, and as described above, when the boundary line L1 between the non-active area NA and the active area AA has the same size as the opened surface L2, an edge of the first glass 212 may be provided to have substantially the same size as the active area AA. Further, when the boundary line L1 between the non-active area NA and the active area AA is positioned at a side of the opening 204a, the size of the first glass 212 may be provided to be larger than the size of the active area AA.

The second glass 210 may be provided on a lower surface of the first glass 212 and positioned inside the frame 204, and thus, the second glass 210 may be implemented to function as an inner glass.

The second glass 210 may be formed to be larger in size than the first glass 212, and at least a portion of the second glass 210 may be formed to comprise a projection corresponding to the above-described circuit portion 208a. According to the present disclosure, at least a portion of the second glass 210 may be positioned at the coupling portion 105 so that the wearing portion 101 may be coupled to the body 202.

The second glass 210 may be formed to be larger in size than the first glass 212. As the second glass 210 is provided to be larger in size than the first glass 212, it may be partitioned into a center portion 210b and the edge portion 210a.

The center portion 210b may be an area that faces a surface of the first glass 212 when the second glass 210 is stacked on the lower surface of the first glass 212.

The edge portion 210a may extend and project from an edge of the center portion 210b beyond the edge of the first glass 212 on the outer surface of the center portion 210b. A surface of the edge portion 210a may be formed to have a step from the edge of the first glass 212.

According to an embodiment of the present disclosure, the edge portion 210a may include a first area 210aa and a second area 210ab similar to the edge portion 110a described in connection with the above embodiment. The structure and configuration thereof are the same as those in the above embodiment, and the description of the above embodiment may apply.

Figure 14:
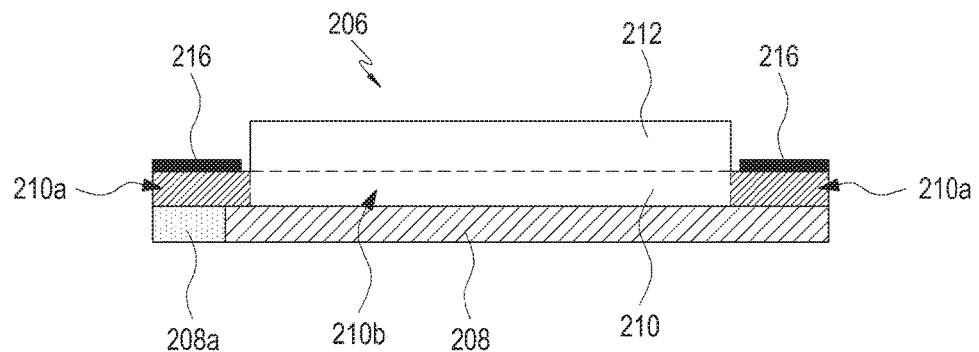
FIG. 14 is a cross-sectional view taken along line D-D' of FIG. 13 according to an embodiment of the present disclosure.

FIG. 14 is a cross-sectional view taken along line D-D' of FIG. 13. FIG. 15 is a view illustrating an example where the display member 206 is assembled with the frame 204 according to an embodiment of the present disclosure.

Referring to FIGS. 14 and 15, a sealing coupler 216 may be included on a surface of the edge portion 210a of the second glass 210 to allow the edge portion 210a to be tightly coupled to an inner surface of the frame 204. The sealing coupler 216 may be formed of a material, such as silicone or urethane.

In the display member 206 described above, the first glass 212 and the second glass 110, which form a single body glass panel 211, may be positioned at a top of the body 202 structure, and the touch panel 208, display panel (not shown), and polarization panel (not shown) may be disposed on a lower surface of the glass panel 211.

The edge portion 210a of the second glass 210 may project beyond the edge of the first glass 212. In particular, the second area 210ab may be provided to project further outward than the first area 210aa. Thus, the first glass 212 may be formed to have a circular shape, and at least a portion of the edge of the second glass 210, at least partially, may be formed to have a circular shape while the remainder of the edge may project outward, so that the edge portion 210a of the second glass 210 is shaped like a hot air balloon.

Therefore, the overall shape of the glass panel 211 may correspond to a hot air balloon, but it is the circular-shaped first glass 212 that is exposed to the outside of the frame 204. Accordingly, the circular-shaped frame 204 and the circular-shaped second glass 110 may be visible to the user. Further, although the non-active area NA is provided to have a hot air balloon shape, as the boundary line between the active area AA and the non-active area NA is positioned close to the circular-shaped opened surface L2 of the frame 204, the active area AA may have the size of the opening of the frame 204, and the edge size of the frame 204 may correspond to the size of the first area 210*aa*.

As such, according to the present disclosure, the display member 206 is assembled upwards from under the frame 204, and double glass parts are stacked so that the glass panel 211 has a stepped edge. Accordingly, the edge of the glass panel 211 may be positioned inside the frame 204, enabling the implementation of the electronic device 100 with a minimized size of the frame 204 the exposed shielding portion 113 and a maximized size of the active area AA in which the body 202, shielding portion 113, and active area AA each have a circular shape regardless of the shape of the edge of the display member 206.

Figure 16:
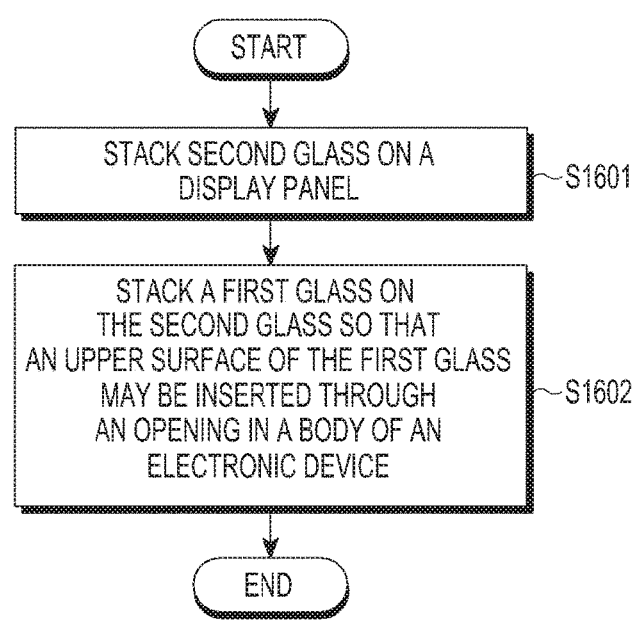
FIG. 16 is a flowchart illustrating a method of forming a body of an electronic device according to an embodiment of the present disclosure.

FIG. 16 illustrates a method of forming a body of an electronic device according to an embodiment of the present disclosure. Referring to FIG. 16, the method begins by stacking a second glass on an upper surface of a display panel such that the second glass comprises a larger surface area than the display panel and an edge portion of the second glass extends over an edge portion of the display panel at operation S1601. Thereafter, a first glass is stacked on an upper surface of the second glass such that the first glass comprises a smaller surface area than both of the second glass and the display panel so as to be inserted through an opening of a frame of the body so that an upper surface of the first glass is exposed to an outside, at operation S1602.

As is apparent from the foregoing description, according to an embodiment of the present disclosure, as the display member is assembled in a down-up manner, upwards from under the frame, the edges of the display member being provided to have different sizes may be positioned on the inside of the frame and covered, and the size of the frame and the exposed shielding portion may be minimized and the size of the active area may be maximized while the body, shielding portion, and active area have a circular shape regardless of the shape of the edge of the display member.

Further, the overall shielding portion may be positioned on the inside of the frame, or a portion of the shielding portion may be exposed to the outside while the remainder of the shielding portion may be positioned on the inside of the frame, so that the shielding portion externally exposed may be slim and have a constant width. Further, the shielding portion exposed to the surface of the body may be rendered to have a constant width or its width may be minimized, allowing the electronic device a more aesthetic look and feel.

Further, as the glass panel is formed in a dual-glass type, the edges of the display member having different shapes may be positioned in the edge of the frame, so that the body and surface of the display member exposed may be formed to have a circular shape without increasing the size of the body as compared with the related art.

Further, as the glass panel is formed in a dual-glass type, the glass panel having a step on the edge portion thereof may be easily manufactured with a low likelihood of damage or with reduced costs when compared with forming the glass panel as a single piece of glass.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a frame; and
a display member exposed through an opening of the frame,
wherein the display member includes:
a first glass exposed through the opening, and
a second glass disposed on a surface of the first glass,
wherein the second glass includes an area formed to project beyond an edge of the first glass, the area of the second glass is positioned inside the frame,
wherein the second glass is provided to have a larger surface area than the first glass,
wherein the second glass comprises:
a center portion corresponding to a surface of the first glass, and
an edge portion including:
a first area that includes an outer edge and projects at a predetermined width outwardly from the center portion, and
a second area including at least a portion of the first area and projecting at a width larger than the predetermined width of the first area,
wherein the display member includes a circular active area that displays a screen and a non-active area surrounding the active area,
wherein the non-active area includes a first non-active area where signal lines are arranged and a second non-active area where a circuit portion is arranged,
wherein the first area identically or partially overlaps the first non-active area and, the second area identically or partially overlaps the second non-active area, and
wherein the second area is disposed between the circuit portion and the frame.

2. The electronic device of claim 1, wherein the first glass and the second glass of the display member are assembled in a manner such that a lower surface of the first glass is stacked on an upper surface of the second glass.

3. The electronic device of claim 1, wherein a shielding portion is provided on a perimeter portion of the second glass to shield the non-active area.

4. The electronic device of claim 3, wherein the shielding portion is provided on the edge portion or on the edge portion and extending inward from the edge portion toward a center of the center portion of the second glass.

5. The electronic device of claim 4,
wherein the shielding portion is provided on the edge portion, and
wherein, when the display member is coupled to the frame, the shielding portion is shielded by the frame.

6. The electronic device of claim 4,
wherein the shielding portion extends inward from the edge portion toward the center of the center portion of the second glass, and
wherein, when the display member is coupled to the frame and a lower surface of the first glass is stacked on an upper surface of the second glass, a portion of the shielding portion is exposed in which the exposed shielding portion comprises a thickness larger than a remainder portion of the shielding portion that is not exposed.

7. The electronic device of claim 1, further comprising a sealing coupler disposed between a surface of the edge portion and an inside of the frame.

8. The electronic device of claim 1, further comprising an optical clear adhesive (OCA) disposed between the first glass and the second glass.

9. An electronic device comprising:
a frame including an opening;
a display member including a glass part, the glass part being provided inside the frame, exposed through the opening, and fixed and seated on the frame; and
an edge portion having a step configuration from a surface of the glass part is provided on an edge surface of the glass part, wherein the glass part provided at an upper side of the edge portion is exposed through the opening, and the glass part provided at a lower side of the edge portion is fixed by the frame to fasten the glass part to the frame,
wherein the glass part comprises:
a first glass disposed upwardly from the step configuration, and
a second glass formed as a single body together with the first glass, the second glass being disposed downwardly from the step configuration and having a larger outer diameter than the first glass by the size of the step configuration,
wherein the second glass comprises:
a center portion corresponding to a surface of the first glass, and
an edge portion including:
a first area including an outer edge and projecting at a predetermined width externally of the center portion, and
a second area disposed in at least a portion of the first area and projecting from the first area to form the edge portion having the step configuration,
wherein the display member includes a circular active area that displays a screen and a non-active area surrounding the active area,
wherein the non-active area includes a first non-active area where signal lines are arranged and a second non-active area where a circuit portion is arranged,
wherein the first area identically or partially overlaps the first non-active area and, the second area identically or partially overlaps the second non-active area, and
wherein the second area is disposed between the circuit portion and the frame.

10. The electronic device of claim 9, wherein the glass part of the display member is assembled in a manner such that a lower surface of the glass part provided at the upper side of the edge portion is stacked on an upper surface of the glass part provided at the lower side of the edge portion and a lower surface of the glass part provided at the lower side of the edge portion is stacked on an upper surface of a display panel.

11. The electronic device of claim 9, wherein a shielding portion is provided on a perimeter portion of the second glass to shield the non-active area.

12. The electronic device of claim 11, wherein the shielding portion is provided on the edge portion or on the edge portion and extending inward from the edge portion toward a center of the center portion of the second glass.

13. The electronic device of claim 12,
wherein the shielding portion is provided on the edge portion, and
wherein, when the display member is coupled to the frame, the shielding portion is shielded by the frame.

14. The electronic device of claim 12,
wherein the shielding portion is provided to extend inwardly from the edge portion toward the center of the center portion of the second glass, and
wherein, when the display member is coupled to the frame, a portion of the shielding portion is exposed in which the exposed shielding portion comprises a thickness larger than a remainder portion of the shielding portion that is not exposed.

15. The electronic device of claim 9, further comprising:
a sealing coupler disposed between a surface of the edge portion and an inside of the frame and configured to adhere the edge portion to the frame.

16. A method of forming a body of art electronic device, the method comprising:
stacking a second glass on art upper surface of a display panel such that the second glass comprises a larger surface area than the display panel and an edge portion of the second glass extends over an edge portion of the display panel; and
stacking a first glass on an upper surface of the second glass such that the first glass comprises a smaller surface area than both of the second glass and the display panel so as to be insertable through an opening of a frame of the body such that an upper surface of the first glass is exposed externally,
wherein the second glass comprises:
a center portion corresponding to a surface of the first glass, and
an edge portion including:
a first area including an outer edge and projecting at a predetermined width externally of the center portion, and
a second area disposed in at least a portion of the first area and projecting from the first area to form the edge portion having the step configuration,
wherein the display member includes a circular active area that displays a screen and a non-active area surrounding the active area,
wherein the non-active area includes a first non-active area where signal lines are arranged and a second non-active area where a circuit portion is arranged,
wherein the first area identically or partially overlaps the first non-active area and, the second area identically or partially overlaps the second non-active area, and
wherein the second area is disposed between the circuit portion and the frame.

* * * * *